United States Patent [19]

Channin

[11] 4,385,805
[45] May 31, 1983

[54] LIQUID CRYSTAL LENS DISPLAY SYSTEM

[75] Inventor: Donald J. Channin, Princeton, N.J.

[73] Assignee: RCA Corporation, New York, N.Y.

[21] Appl. No.: 165,761

[22] Filed: Jul. 3, 1980

Related U.S. Application Data

[63] Continuation of Ser. No. 902,738, May 3, 1978, abandoned, which is a continuation-in-part of Ser. No. 736,883, Oct. 29, 1976, abandoned.

[51] Int. Cl.³ ............................................. G02F 1/13
[52] U.S. Cl. .................................... 350/334; 350/336; 350/347 V
[58] Field of Search ................... 350/334, 336, 347 V, 350/356, 379, 392, 393

[56] References Cited

U.S. PATENT DOCUMENTS 4,054,362 10/1977 Baues ........................... 350/347 V X

OTHER PUBLICATIONS

Wild, P. J. et al., "Liquid Crystal Bar Graph Displays", *IEE Conference Publication No. 80*, (Conference held Sep. 7-10, 1971), pp. 161-164.
Channin, D. J., "Optical Waveguide Modulation Using Nematic Liquid Crystal", *Applied Physics Letters*, vol. 22, No. 8, (Apr. 15, 1973), pp. 365-366.
Marchand, E. W., *Gradient Index Optics*, N.Y., Academic Press, 1978, pp. 1-14.

*Primary Examiner*—John K. Corbin
*Assistant Examiner*—Richard Gallivan
*Attorney, Agent, or Firm*—Birgit E. Morris; H. Christoffersen

[57] ABSTRACT

A liquid crystal lens display system comprises a liquid crystal lens, display elements, a polarizer and a light source. The liquid crystal lens comprises a dielectrically anisotropic liquid crystal material covering two electrodes each having a plurality of spaced, parallel, interleaved fingers. The display elements comprise one or more elements to which are affixed alphanumeric or analog information and which are optically distinguishable. The angle of refraction of light passing through the liquid crystal lens is electrically alterable by applying a voltage source to the lens' electrodes. Portions of one of the display elements viewed through an activated liquid crystal lens are changed since light from these portions are no longer within the field of view of the observer.

8 Claims, 9 Drawing Figures

LIQUID CRYSTAL LENS DISPLAY SYSTEM

This is a continuation of application Ser. No. 902,738, filed May 3, 1978, now abandoned, which in turn is a continuation-in-part of our copending application, Ser. No. 736,883, filed Oct. 29, 1976, now abandoned.

The present invention relates to a liquid crystal lens display system and to the use of a liquid crystal lens to implement such a system.

BACKGROUND OF THE INVENTION

The ability of liquid crystal materials to change optically under the influence of an electric field makes them useful for a variety of applications, such as light valves, displays, etc. One prior art application of electrically controllable dynamic scattering materials employs a structure which is a cell of sandwich configuration comprising a front set of transparent planar electrodes and a specularly reflective back electrode spaced from the front electrode system. Between the two electrode systems is located a layer of active nematic material. With no electric field applied between the two electrode sets, the liquid crystal material is optically traansparent. Thus, if the back electrode reflects a black background, the cell looks black to an observer looking into it through its transparent front electrode system. However, when an unidirectional or alternating electric field is applied between the two spaced electrode systems, the liquid loses its transparent characteristic, scattering any light flowing into it through its transparent front electrode system. The scattered light is returned to the observer and the apparent color of the cell is generally of the same spectral content as the light passing into it through the front electrode system, i.e., nearly white in the usual circumstance. When the electric field is removed, the material reverts to its transparent state and looks black to the observer.

The scattering effect in these prior art devices in the presence of an electric field has been explained by ions set in motion as electrical current which pass through the normally aligned nematic medium thereby producing shearing disruptive forces. The turbulence thus produced causes localized variations in the effective index of refraction of the medium which in turn scatter the light passing through the cell.

In U.S. Pat. No. 3,807,831, issued to Richard A. Soref on Apr. 30, 1974, the patentee suggested the use of a liquid crystal cell comprising a liquid crystal layer and a pair of interleaved electrode sets on one side of the liquid crystal layer with polarizers oriented either parallel or perpendicular to one another on the two sides of the liquid crystal device. When an electric field is applied between adjacent pairs of electrodes the individual molecules reorient thus producing a birefringence in the liquid crystal layer. Depending upon whether the polarizers are oriented parallel or perpendicular to one another, the optical transmission of the cell will either decrease or increase in those portions of the cell where the electric field is applied. In Soref's patent the liquid crystal layer thickness varied from about 0.5 micron to about 1.5 microns and the aspect ratio of liquid crystal layer thickness to the interelectrode spacing varied from about 0.04 to about 0.15. Soref does not teach the use of such a device as a lens.

In U.S. Pat. No. 3,981,559, issued to Donald J. Channin on Sept. 21, 1976, the patentee suggested the use of a liquid crystal cell comprising a liquid crystal layer, a pair of interleaved electrodes on one side of said layer, a planar electrode on the opposed side of said layer, voltage means to apply an electric field between the pair of interleaved electrodes, and voltage means to apply an electric field between one of the pair of interleaved electrodes and said planar electrode. Channin did not teach the use of this cell as a lens in conjunction with other display elements to form a display system.

SUMMARY OF THE INVENTION

A liquid crystal lens display system comprises a liquid crystal lens array, hereinafter a liquid crystal lens, foreground and background display elements positioned spaced apart from the lens, a linear polarizer oriented perpendicular to the electrodes of the liquid crystal lens system and a light source. The liquid crystal lens comprises a dielectrically anisotropic liquid crystal material covering a first electrode having a plurality of spaced parallel fingers, and a second electrode having a plurality of spaced parallel fingers interleaved with the fingers of the first electrode. When voltages are applied to the first and the second electrodes to establish an electric field between them, the angle of refraction of light passing through the lens is changed. Light from the foreground display element is refracted out of the field of view of an observer while light from the background display element is refracted into the field of view of the observer. Thus the content of the display elements appears to the observer to have changed.

DETAILED DESCRIPTION OF THE INVENTION

Figure 1:
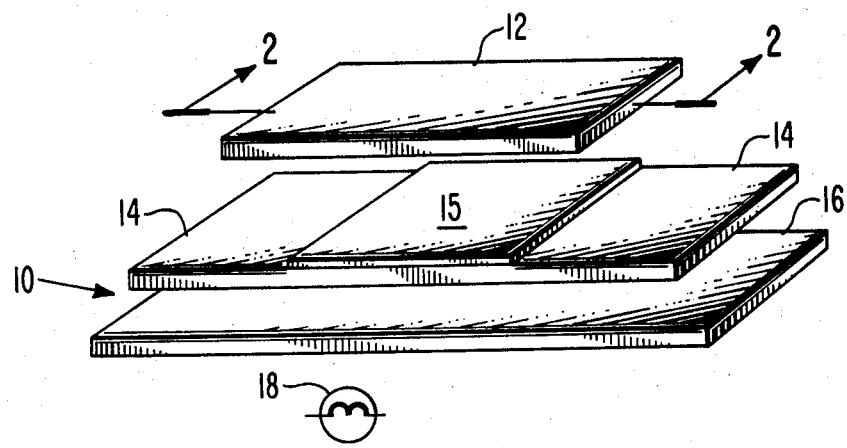
FIG. 1 is a schematic illustration of a liquid crystal lens display system of the invention.

The liquid crystal lens display system 10 of the present invention is shown in FIG. 1. The system 10 comprises a liquid crystal lens 12, a background display element 14 and a foreground display element 15, a polarizer 16 and a light source 18. The polarizer 16 is in front of the light source 18; the display elements 14 and 15 are in front of the polarizer 16; the lens 12 is separated from the display elements 14 and 15 and covers the foreground display element 15 and the background display element 14.

Figure 2:
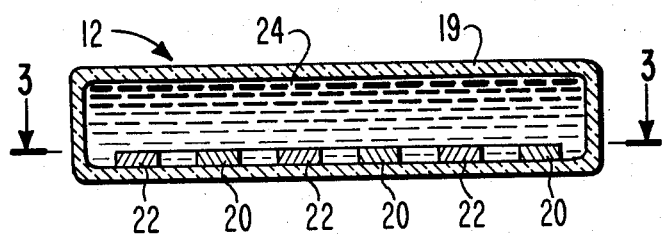
FIG. 2 is a cross-sectional view of the liquid crystal lens of FIG. 1 taken along line 2—2 of FIG. 1.
Figure 3:
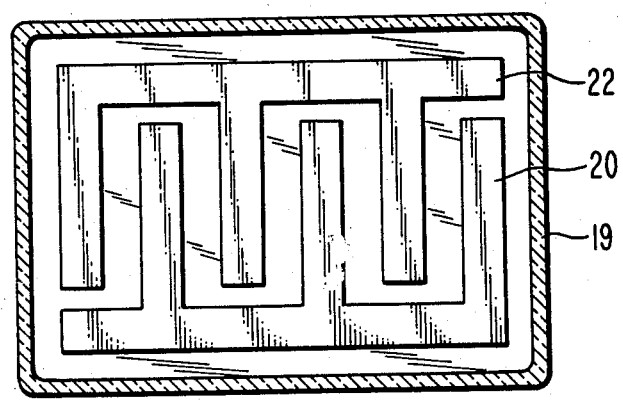
FIG. 3 is a cross-sectional view of the liquid crystal lens taken along line 3—3 of FIG. 2.

The liquid crystal lens 12 is shown in cross-sectional view in FIGS. 2 and 3. By "liquid crystal lens" it is meant a liquid crystal device which, although it does not have a curved surface as a conventional lens, functions in a manner similar to a conventional cylindrical lens when the liquid crystal device is electrically activated. The lens comprises a container 19 which is filled with a liquid crystal material 24. The container 19 is of an optically transparent and electrically insulating material, such as glass. The liquid crystal material 24 is of any of the well known dielectrically anisotropic liquid crystal materials and is preferably a positive liquid crystal material such as Field Effect II, manufactured by Eastman Chemical Products, Inc.

On the inner surface of one wall of the container 19 is a first electrode 20, which includes a plurality of spaced, parallel fingers electrically connected in parallel, and a second electrode 22 which also includes a plurality of spaced, parallel fingers electrically connected in parallel. The fingers of the first and second electrodes 20 and 22 are interleaved. Although the electrodes 20 and 22 are shown as having three fingers, they can have a larger numer of fingers. The surfaces of the container 19 are treated in a manner well known in the art of liquid crystals to obtain a molecular alignment of the liquid crystal material 24 which is perpendicular to the surface of the container in the absence of electrical excitation.

Figure 4:
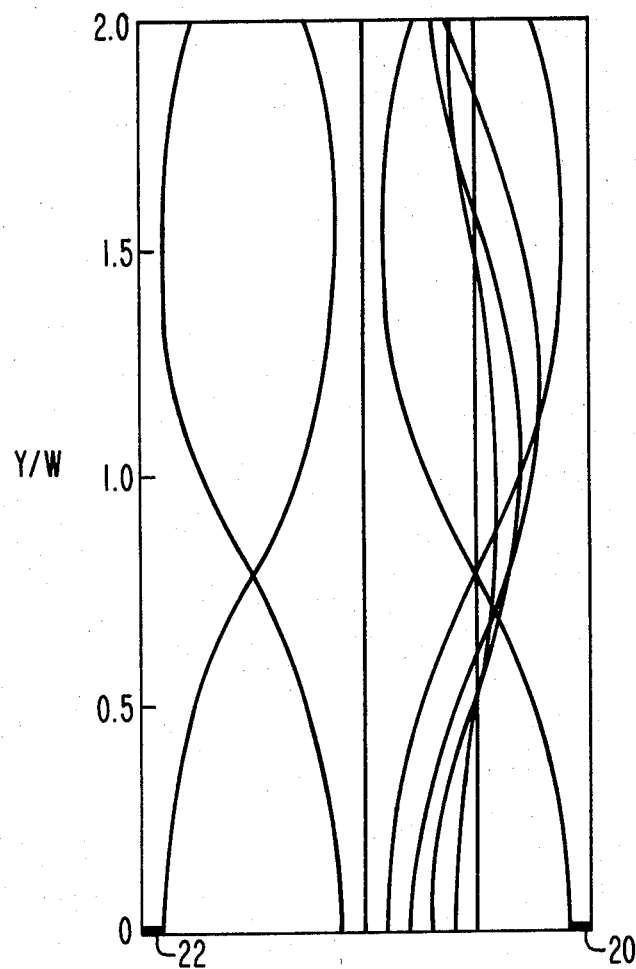
FIG. 4 shows calculated light ray trajectories for light rays entering one surface of the liquid crystal lens at normal incidence as a function of the liquid crystal layer thickness.

The inter-electrode spacing in the liquid crystal cell lens 12 is about 25 microns. The thickness of the liquid crystal layer can vary from about 12 microns to about 50 microns. The ratio of the width of the liquid crystal layer 24 to the inter-electrode spacing, or aspect ratio, thus varies from about 0.5 to about 2. The liquid crystal lens 12 acts like a lens in that it changes the direction of light rays passing through it by refraction. Application of a voltage difference between electrodes 20 and 22 causes a spacially varying reorientation of the molecules, producing a spatially varying index of refraction for light polarized perpendicular to the interleaved electrodes. Thus each pair of electrodes forms a lens with the sum of the pairs of electrodes forming the liquid crystal lens array. The spatial variation of the index of refraction is in the plane perpendicular to the interleaved electrodes. The calculated directions of propagation of several light rays entering the lens 12 between electrodes 20 and 22 at normal incidence to the cell wall 19 are shown in FIG. 4 as a function of the aspect ratio. The directions of propagation of light rays entering non-normal to the walls of the container 19 are similarly affected. From FIG. 4 it can be understood that appropriately polarized light rays propagating through such a lens will undergo large changes in their directions of propagation in the direction perpendicular to the interleaved electrodes. It can be further understood from FIG. 4 that in a liquid crystal lens whose aspect ratio is about 0.15 or less there will be very little change in the directions of propagation of light rays passing through such a cell.

The display elements 14 and 15 are comprised of a transparent or translucent material such as glass to permit the passage of light through said display elements, and contain different alphanumeric or analog information and are optically distinguishable from one another. For example, said display elements could be differently colored transparent glasses or alternatively, display element 14 could have a graduated scale in or bonded to one of its surfaces while display element 15 could be a transparent colored glass. An analagous device having foreground and background display elements is a common household thermometer in which the background display element is a graduated temperature scale and the foreground display element is a column of mercury. It is sufficient that the display elements 14 and 15 of the invention be optically distinguishable from one another when viewed through the liquid crystal lens.

The polarizer 16 is oriented such that light from the light source 18 passing through the polarizer 16 is polarized in a direction perpendicular to the electrodes 20 and 22 of the lens 12.

Although the display system 10 is shown with the light source 18 and polarizer 16 behind the display elements 14 and 15, the light source 18 and polarizer can be in front of the liquid crystal lens and the display elements with the light being reflected off of the display elements 14 and 15.

Figure 5:
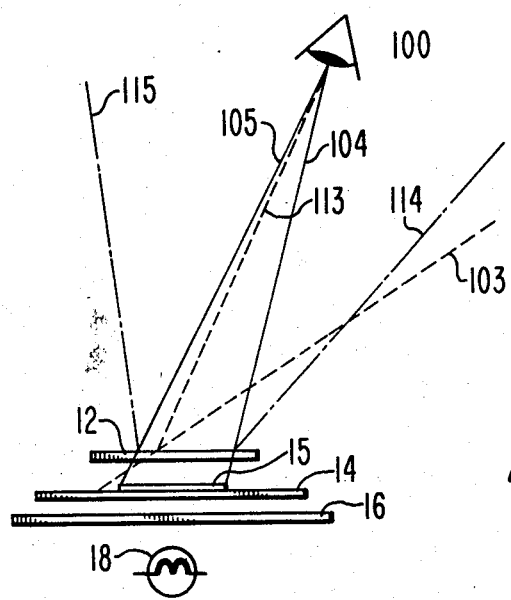
FIG. 5 is a schematic view of the operation of the liquid crystal lens display system of the invention.

The liquid crystal lens display system of the invention is shown schematically in FIG. 5 in its operating mode. In the absence of an applied voltage on the electrodes 20 and 22, the lens 12 is not excited and light rays 104 and 105 from the display element 15 are within the acceptance aperture of the observer 100 and are seen. Light ray 103 from display element 14 is not within the acceptance aperture of the observer 100 and thus is not seen. Upon application of a voltage to electrodes 20 and 22 light rays 104 and 105 are refracted into the directions of rays 114 and 115 respectively; they are not within the acceptance aperture of the observer 100 and are thus not seen. Ray 103 is refracted into the direction of ray 113 and is seen by the observer 100 as coming from the foreground display element 15. Thus the result is that the observer 100 does not see the foreground display element 15 but rather the background display element 14 shifted into the position of element 15 by refraction. This is analagous to the offset in position due to refraction which occurs when one observes an underwater object from an angle other than normal to the surface of the water. Ray 103 is typical of rays from the background element 14. For a significant fraction of the rays from background element 14 to be refracted into the acceptance angle of observer 100, the liquid crystal lens 12 must be spaced an appropriate distance from the display elements 14 and 15. An appropriate distance has been found to be about equal to the width of the foreground display element 15.

It is to be understood from the foregoing discussion and from the figures that the light rays are only refracted in the direction perpendicular to the electrodes since the changes in the index of refraction of the liquid crystal layer 24 are uniform parallel to the electrodes.

Figure 6:
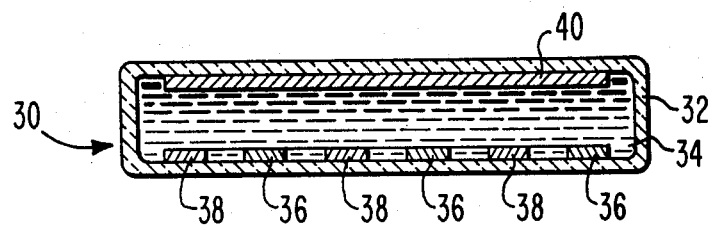
FIG. 6 is a cross-sectional view of another liquid crystal lens suitable for use in the display system of the invention.

A cross-sectional view of another embodiment of a liquid crystal lens 30 is shown in FIG. 6. The lens 30 comprises a container 32, of a transparent material such as glass. Within the container is a liquid crystal material 34. On one of the inner surfaces of the container 32 is a *first* electrode 36 comprising a plurality of fingers. On that same one surface is a second electrode 38 also comprising a plurality of fingers. On a surface opposite the one surface in the container 32 is a planar transparent electrode 40. The lens 30 is similar to the lens 12 except with the addition of the planar electrode 40.

In the operation of the lens 30 voltage sources (not shown) are connected to the first electrode 36 and second electrode 38, establishing a field between the electrodes 36 and 38. Another voltage source (also not shown) is connected to the planar electrode 40. The voltage source to the planar electrode 40 has a voltage potential between the potential of the voltage source to the first electrode 36 and the potential of the voltage source to the second electrode 38. By varying the potential of the voltage source to the planar electrode 40, the field within the lens 30 can be varied. The variation in the potential of the voltage source to the planar electrode 40 causes a variation in the birefringent property of the lens 30.

Figure 7A:
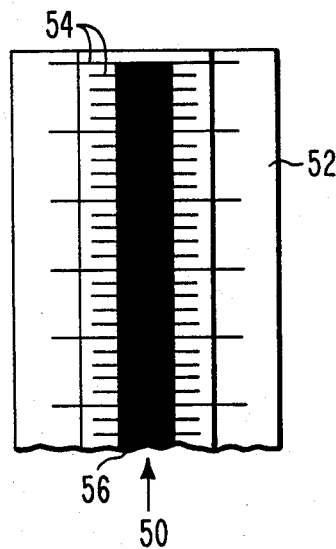
FIGS. 7a and 7c are front views of a bargraph display using the liquid crystal display system of the invention.
Figure 7B:
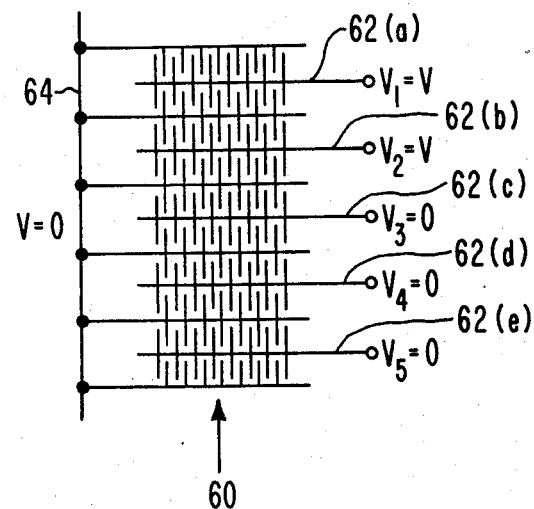
FIG. 7b shows a liquid crystal lens electrode system.
Figure 7C:
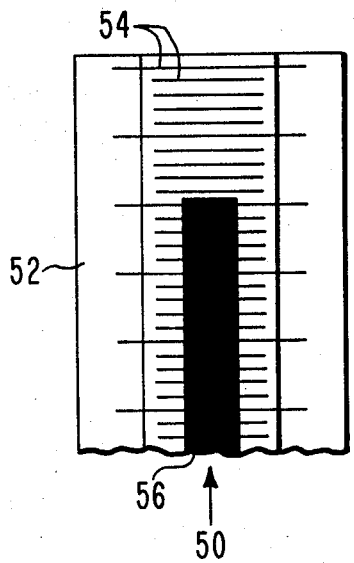

The display system 10 of the present invention can be used for any type of display which requires a change between two designs, such as a change in color, etc. For example, the display system 10 can be used as a bargraph display 50 as shown in FIG. 7a. In the bargraph display 50 the background display element 52 has the spaced, parallel indicia lines 54 and the foreground display element 56 is a dark color bar line which extends across the indicia lines 54. The liquid crystal lens electrode system 60 is shown in FIG. 7b. The electrode system 60 comprises two sets of interleaved electrodes 62 and 64. In one mode of operation the set of electrodes 64 are interconnected and set to zero applied voltage. Each of the set of electrodes 62 is independently connected to a voltage supply not shown. If the electrodes 62(a) and 62(b) are connected to positive voltage sources of magnitude V and the remainder of the electrodes 62(c), (d), (e), etc. are connected to voltage sources at zero applied volts then the appearance of the bargraph display 50 will change from that shown in FIG. 7a to that shown in FIG. 7c. That portion of the foreground display element 56 under the activated lens elements 62(a) and 62(b) appear to disappear since the activated lens elements refract the light out of the observer's field of view. In this way the length of the foreground bar can be varied to provide the desired bargraph display by activating various ones of the liquid crystal lenses.

I claim:
1. A liquid crystal lens display system comprising:
   a background display element;
   a foreground display element overlying the background display element;
   a liquid crystal lens array having a dielectrically anisotropic liquid crystal material covering a first electrode having a plurality of spaced, parallel fingers, and a second electrode having a plurality of spaced, parallel fingers and interleaved with the fingers of the first electrode wherein the lens array is positioned spaced apart from the background and foreground display elements such that the foreground and background display elements are observed through the lens array;
   illumination means for illuminating the foreground and background display elements with light which is linearly polarized perpendicular to the parallel electrode fingers; and
   means for applying voltage sources to fingers of the first electrode and the corresponding fingers of the second electrode to establish an electric field between said fingers, such that a portion of the foreground display element is obscured by means of the activated fingers causing a variation in the refractive index of the liquid crystal and such that only the corresponding portion of the background display element is observed through the lens array.

2. A system according to claim 1 wherein the spacing between the first electrode and the second electrode of said liquid crystal lens is about 25 microns; and where the thickness of said liquid crystal material is from about 12 microns to about 50 microns.

3. The system of claim 2 further including;
   a planar electrode spaced from the first and second electrodes with the liquid crystal material being between the planar electrode and the first and second electrodes; and
   means for applying a voltage source to the planar electrode.

4. The system of claim 3 wherein the voltage level of the voltage means applied to the planar electrode is between the voltage levels of the voltage means applied to the first and second electrodes.

5. The system of claim 1 wherein the first electrode and the second electrode are interposed between the liquid crystal material and the display.

6. A liquid crystal display system in accordance with claim 1 in which the foreground display element and the background display element are different in design such that they are optically distinguishable.

7. A liquid crystal lens display system according to claim 1 wherein the illumination means comprises a light source and a linear polarizer positioned so that the foreground and background display elements are illuminated by transmission of light through the display elements.

8. A liquid crystal lens display system according to claim 1 wherein the illumination means comprises a light source and a linear polarizer positioned so that the foreground and background display elements are illuminated by reflection of light from the display elements.

* * * * *